(12) United States Patent
Bassoli et al.

(10) Patent No.: US 10,379,173 B2
(45) Date of Patent: Aug. 13, 2019

(54) CALIBRATION METHOD FOR MAGNETIC FIELD SENSING DEVICES, CORRESPONDING SYSTEM, APPARATUS AND COMPUTER PROGRAM PRODUCT

(71) Applicant: STMicroelectronics S.r.l., Agrate Brianza (IT)

(72) Inventors: Rossella Bassoli, Monza (IT); Carlo Crippa, Merate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 321 days.

(21) Appl. No.: 15/076,225

(22) Filed: Mar. 21, 2016

(65) Prior Publication Data

US 2017/0059667 A1    Mar. 2, 2017

(30) Foreign Application Priority Data

Sep. 1, 2015   (IT) .......................... 102015000047741

(51) Int. Cl.
```
G01R 33/00      (2006.01)
G01R 35/00      (2006.01)
G01C 17/38      (2006.01)
```
(52) U.S. Cl.
CPC ......... *G01R 33/0035* (2013.01); *G01C 17/38* (2013.01); *G01R 35/00* (2013.01)

(58) Field of Classification Search
CPC ............................. G01R 33/00; G01R 33/0017; G01R 33/0023; G01R 33/0029; G01R 33/0035; G01R 35/00; G01C 17/38
See application file for complete search history.

(56) References Cited

U.S. PATENT DOCUMENTS

| | | | | |
|---|---|---|---|---|
| 7,930,148 | B1 * | 4/2011 | Figaro ................... | E21B 47/022 33/312 |
| 2008/0208527 | A1 * | 8/2008 | Kavaklioglu ........ | C10G 11/187 702/179 |
| 2011/0301897 | A1 * | 12/2011 | Weiss ..................... | G01C 17/38 702/85 |
| 2011/0301904 | A1 * | 12/2011 | Bartholomeyczik .. | G01C 17/38 702/104 |
| 2012/0086438 | A1 * | 4/2012 | Tu ....................... | G01R 33/0035 324/202 |
| 2015/0177020 | A1 | 6/2015 | An et al. | |
| 2015/0241390 | A1 * | 8/2015 | Figaro ................... | G01N 19/00 702/65 |

FOREIGN PATENT DOCUMENTS

| | | |
|---|---|---|
| CN | 101156120 A | 4/2008 |
| CN | 102353917 A | 2/2012 |
| CN | 104865539 A | 8/2015 |

* cited by examiner

*Primary Examiner* — Son T Le
(74) *Attorney, Agent, or Firm* — Seed IP Law Group LLP

(57) ABSTRACT

A magnetic field sensor generates signal components corresponding to an uncalibrated representation of a sensed magnetic field in a three-dimensional coordinate system. A reader coupled to the magnetic field sensor determines a center offset based on received signal components, adjusts the received signal components based on the determined center offset, and applies Kalman filtering to the adjusted signal components, generating a set of ellipsoid parameters. The reader generates calibrated signal components based on the determined center offset and the generated set of ellipsoid parameters.

24 Claims, 2 Drawing Sheets

CALIBRATION METHOD FOR MAGNETIC FIELD SENSING DEVICES, CORRESPONDING SYSTEM, APPARATUS AND COMPUTER PROGRAM PRODUCT

BACKGROUND

Technical Field

The description relates to magnetic field sensing devices and to calibration of field sensing devices such as e.g., magnetometers, compasses, sensor HUBs.

Description of the Related Art

When adequately calibrated, a magnetic field sensing device such as e.g., a magnetometer may sense the magnetic field of the earth (around 0.5 Gauss) with no additional contributions. However, local disturbances may exist in an ambient magnetic field due e.g., to nearby magnetic fields generated by electrical currents and nearby magnetic objects, such as ferrous or high permeability materials.

These local disturbances may produce two types of distortions, known as hard-iron offsets and soft-iron distortions.

BRIEF SUMMARY

In an embodiment, a method comprises: receiving signal components of a magnetic field sensing device, the signal components corresponding to an uncalibrated representation of a sensed magnetic field in a three-dimensional coordinate system; determining a center offset based on the received signal components; adjusting the signal components based on the determined center offset; applying Kalman filtering to the adjusted signal components, generating a set of ellipsoid parameters; and generating calibrated signal components based on the determined center offset and the generated set of ellipsoid parameters. In an embodiment, the method comprises: estimating a gain of the received signal components; and tuning the Kalman filtering based on the estimated gain of the signal components. In an embodiment, the generated calibrated signal components correspond to a centered, spherical magnetic field in the three-dimensional coordinate system. In an embodiment, the generating calibrated signal components comprises: translating an ellipsoid center corresponding to the ellipsoid parameters to an origin of the three-dimensional coordinate system; rotating axes corresponding to the ellipsoid parameters to align with axes of the three-dimensional coordinate system; scaling the ellipsoid parameters to define a sphere; and rotating axes of the defined sphere to align with a pre-rotation orientation of the axes corresponding to the ellipsoid parameters. In an embodiment, with said ellipsoid parameters defining an ellipsoid in quadratic form as:

$$ax^2 + 2bxy + 2cxz + dy^2 + 2eyz + fz^2 + 2gx + 2hy + 2iz + l = 0$$

$$B = \begin{bmatrix} a & b & c \\ b & d & e \\ c & e & f \end{bmatrix}$$

and with m1, m2, m3 representing respective received signal components in the three-dimensional coordinate system as follows:

$$-m1^2 = \frac{d}{a}m2^2 + \frac{f}{a}m3^2 + \frac{2g}{a}m1 + \frac{2h}{a}m2 +$$
$$\frac{2i}{a}m3 + \frac{l}{a} + \frac{2b}{a}m1m2 + \frac{2c}{a}m1m3 + \frac{2e}{a}m2m3$$

$$z_n = -m1^2$$

$$H_n = [\, m2^2 \quad m3^2 \quad 2m1 \quad 2m2 \quad 2m3 \quad 1 \quad 2m1m2 \quad 2m1m3 \quad 2m2m3 \,]$$

$$X_n = [\, X(0) \quad X(1) \quad X(2) \quad X(3) \quad X(4) \quad X(5) \quad X(6) \quad X(7) \quad X(8) \,]$$

$$zres = z_n - z'_n = z_n - H_n X_{n-1}$$

said applying Kalman filter includes:
predicting values $$X'_n = X_{n-1}$$

$$P'_n = P_{n-1} + Q$$

$$z'_n = H_n X'_n;$$

and
correcting values $$k_n = P'_n H_n^T (H_n P'_n H_n^T + R)$$

$$X_n = X'_n + k_n (z_n - z'_n)$$

$$P_n = (I - k_n H_n) P'_n;$$

In an embodiment, the method comprises: applying to said received signal components at least one of: filtering; derivative filtering of a FIR type; averaging; exponential smoothed averaging; comparing absolute values of said received signal components to upper value thresholds, said upper value thresholds being reached being indicative of a starting of movement of the magnetic field sensing device; comparing absolute values of said received signal components to lower value thresholds, said lower value thresholds being reached being indicative of a stopping of movement of the magnetic field sensing device; and selectively applying said Kalman filtering based on detecting movement of the magnetic field sensing device. In an embodiment, the method comprises: detecting movement of the magnetic field sensing device; storing values of said received signal components from the magnetic field sensing device upon detecting movement of the magnetic field sensing device; and subtracting the values stored from subsequently received signal components prior to applying said Kalman filtering. In an embodiment, the method comprises: adjusting the determined center component based on said stored values before generating the calibrated signal components. In an embodiment, the method comprises: estimating the gain of said received signal components based on a difference of maximum and minimum values of said received signal components. In an embodiment, the method comprises: comparing a difference between signal components predicted based on the Kalman filtering and current received signal components to an anomaly threshold; discontinuing Kalman filtering when the difference reaches the anomaly threshold; and resuming Kalman filtering when movement of the magnetic field sensing device from a rest position is detected.

In an embodiment, a device comprises: an input, which, in operation, receives signal components of a magnetic field sensing device, the signal components corresponding to an uncalibrated representation of a sensed magnetic field in a three-dimensional coordinate system; and circuitry coupled to the input, wherein the circuitry, in operation: determines a center offset based on the received signal components; adjusts the signal components based on the determined center offset; applies Kalman filtering to the adjusted signal components, generating a set of ellipsoid parameters; and generates calibrated signal components based on the determined center offset and the generated set of ellipsoid parameters. In an embodiment, the circuitry, in operation: estimates a gain of the received signal components; and tunes the Kalman filtering based on the estimated gain of the signal components. In an embodiment, the generated calibrated signal components correspond to a centered, spherical magnetic field in the three-dimensional coordinate system. In an embodiment, the circuitry, in operation, generates the calibrated signal components by: translating an ellipsoid center corresponding to the ellipsoid parameters to an origin of the three-dimensional coordinate system; rotating axes corresponding to the ellipsoid parameters to align with axes of the three-dimensional coordinate system; scaling the ellipsoid parameters to define a sphere; and rotating axes of the defined sphere to align with a pre-rotation orientation of the axes corresponding to the ellipsoid parameters. In an embodiment, the circuitry, in operation applies to said received signal components at least one of: filtering; derivative filtering of a FIR type; averaging; exponential smoothed averaging; comparing absolute values of said received signal components to upper value thresholds, said upper value thresholds being reached being indicative of a starting of movement of the magnetic field sensing device; comparing absolute values of said received signal components to lower value thresholds, said lower value thresholds being reached being indicative of a stopping of movement of the magnetic field sensing device; and selectively applying said Kalman filtering based on detecting movement of the magnetic field sensing device. In an embodiment, the circuitry, in operation: detects movement of the magnetic field sensing device; stores values of said received signal components from the magnetic field sensing device upon detecting movement of the magnetic field sensing device; and subtracts the values stored from subsequently received signal components prior to applying said Kalman filtering. In an embodiment, the circuitry, in operation: adjusts the determined center component based on said stored values before generating the calibrated signal components. In an embodiment, the circuitry, in operation: compares a difference between signal components predicted based on Kalman filtering and current received signal components to an anomaly threshold; discontinues Kalman filtering when the difference reaches the anomaly threshold; and resumes Kalman filtering in response to detecting movement of the magnetic field sensing device from a rest position.

In an embodiment, a system comprises: a magnetic field sensor configured to generate signal components corresponding to an uncalibrated representation of a sensed magnetic field in a three-dimensional coordinate system; and reading circuitry coupled to the magnetic field sensor and configured to: determine a center offset based on received signal components; adjust the received signal components based on the determined center offset; apply Kalman filtering to the adjusted signal components, generating a set of ellipsoid parameters; and generate calibrated signal components based on the determined center offset and the generated set of ellipsoid parameters. In an embodiment, the reading circuitry is configured to: estimate a gain of the received signal components; and tune the Kalman filtering based on the estimated gain of the signal components. In an embodiment, the generated calibrated signal components correspond to a centered, spherical magnetic field in the three-dimensional coordinate system. In an embodiment, the reading circuitry is configured to generate the calibrated signal components by: translating an ellipsoid center corresponding to the ellipsoid parameters to an origin of the three-dimensional coordinate system; rotating axes corresponding to the ellipsoid parameters to align with axes of the three-dimensional coordinate system; scaling the ellipsoid parameters to define a sphere; and rotating axes of the defined sphere to align with a pre-rotation orientation of the axes corresponding to the ellipsoid parameters.

In an embodiment, a non-transitory computer-readable medium's contents configure a magnetic field sensor reading device to perform a method, the method comprising: determining a center offset based on signal components generated by a magnetic field sensing device, the signal components corresponding to an uncalibrated representation of a sensed magnetic field in a three-dimensional coordinate system; adjusting the signal components based on the determined center offset; applying Kalman filtering to the adjusted signal components, generating a set of ellipsoid parameters; and generating calibrated signal components based on the determined center offset and the generated set of ellipsoid parameters. In an embodiment, the method comprises: estimating a gain of the received signal components; and tuning the Kalman filtering based on the estimated gain of the signal components. In an embodiment, generating the calibrated signal components comprises: translating an ellipsoid center corresponding to the ellipsoid parameters to an origin of the three-dimensional coordinate system; rotating axes corresponding to the ellipsoid parameters to align with axes of the three-dimensional coordinate system; scaling the ellipsoid parameters to define a sphere; and rotating axes of the defined sphere to align with a pre-rotation orientation of the axes corresponding to the ellipsoid parameters.

In an embodiment, a method of calibrating a magnetic field sensing device, wherein calibrated sensing signal components represented in a three-dimensional coordinate system by a spherical graph centered at the origin of said three-dimensional coordinate system are generated from uncalibrated signal components from said magnetic field sensing device represented in said three-dimensional coordinate system by an ellipsoidal graph having a center offset with respect to the origin of said three-dimensional coordinate system, includes applying to said sensing signal components Kalman filter processing yielding a set of parameters fitting said ellipsoidal graph by prediction and correction based on said prediction. In an embodiment, the method includes processing said set of parameters fitting said ellipsoidal graph obtained from Kalman filter processing by: a) translating the center of said ellipsoidal graph towards the origin of said three-dimensional coordinate system, b) rotating said ellipsoidal graph to align the axes thereof with the sensing device axes, c) scaling the ellipsoidal graph to a sphere, and d) back-rotating the sphere resulting from scaling to the orientation of said ellipsoidal graph before said rotation under b). In an embodiment, said ellipsoidal graph is expressed in quadratic form as:

$$ax^2 + 2bxy + 2cxz + dy^2 + 2eyz + fz^2 + 2gx + 2hy + 2iz + l = 0$$

$$B = \begin{bmatrix} a & b & c \\ b & d & e \\ c & e & f \end{bmatrix}$$

by denoting as m1, m2, m3 the X, Y, Z sensing signal components:

$$-m1^2 = \frac{d}{a}m2^2 + \frac{f}{a}m3^2 + \frac{2g}{a}m1 + \frac{2h}{a}m2 +$$
$$\frac{2i}{a}m3 + \frac{l}{a} + \frac{2b}{a}m1m2 + \frac{2c}{a}m1m3 + \frac{2e}{a}m2m3$$

$$z_n = -m1^2$$

$$H_n = [\,m2^2 \quad m3^2 \quad 2m1 \quad 2m2 \quad 2m3 \quad 1 \quad 2m1m2 \quad 2m1m3 \quad 2m2m3\,]$$

$$X_n = [\,X(0) \quad X(1) \quad X(2) \quad X(3) \quad X(4) \quad X(5) \quad X(6) \quad X(7) \quad X(8)\,]$$

$$zres = z_n - z'_n = z_n - H_n X_{n-1}$$

said Kalman filter processing includes
predicting values $$X'_n = X_{n-1}$$

$$P'_n = P_{n-1} + Q$$

$$z'_n = H_n X'_n$$

and
correcting values $$k_n = P'_n H_n^T / (H_n P'_n H_n^T + R)$$

$$X_n = X'_n + k_n(z_n - z'_n)$$

$$P_n = (I - k_n H_n) P'_n$$

In an embodiment, the method includes: applying to said sensing signal components at least one of filtering, derivative filtering of the FIR type, and averaging, exponential smoothed averaging, and/or checking said sensing signal components against upper value thresholds, said upper value thresholds being reached being indicative of movement of the magnetic field sensing device being started, and/or checking said sensing signal components against lower value thresholds, said absolute value thresholds being reached being indicative of movement of the magnetic field sensing device being stopped, and/or performing said Kalman filter processing conditional to detecting movement of the magnetic field sensing device. In an embodiment, the method includes: detecting movement of the magnetic field sensing device, storing the values of said sensing signal components from the magnetic field sensing device upon detecting movement of the magnetic field sensing device, and subtracting the values stored from said sensing signal components forwarded to said Kalman filter processing, restoring said stored values in the calibrated sensing signal components. In an embodiment, the method includes estimating the gain of said sensing signal components forwarded to said Kalman filter processing, for example as difference of maximum and minimum values of said sensing signal components. In an embodiment, the method includes: checking if the difference between the sensing signal components as predicted in Kalman filter processing and the current sensing signal components reaches an anomaly threshold, if said difference reaches said anomaly threshold, discontinuing Kalman filter processing and resuming Kalman filter processing at a subsequent sensing movement, for example from a rest condition.

In an embodiment, a system for calibrating a magnetic field sensing device, wherein calibrated sensing signal components represented in a three-dimensional coordinate system by a spherical graph centered at the origin of said three-dimensional coordinate system are generated from uncalibrated signal components from said magnetic field sensing device represented in said three-dimensional coordinate system by an ellipsoidal graph having a center offset with respect to the origin of said three-dimensional coordinate system, includes a Kalman filter module for applying to said sensing signal components Kalman filter processing yielding a set of parameters fitting said ellipsoidal graph by prediction and correction based on said prediction.

One or more embodiments may relate to a corresponding system and apparatus (e.g., magnetometer-based apparatus) including such a system as well as a computer program product loadable the memory of at least one processing device (e.g., a DSP) and including software code portions for executing the steps of the method when the product is run on at least one computer. As used herein, reference to such a computer program product is understood as being equivalent to reference to a computer-readable means containing instructions for controlling the processing system in order to co-ordinate implementation of the method according to one or more embodiments. Reference to "at least one processor device" is intended to highlight the possibility for one or more embodiments to be implemented in modular and/or distributed form.

The claims are an integral part of the disclosure of one or more exemplary embodiments as provided herein.

One or more embodiments may involve tuning of a Kalman filter coupled e.g., to a magnetometer with the ability of coping with a large range of soft iron distortions with good performance in term of fitting speed.

Advantages offered by one or more embodiments may include:

a wide range of hard-iron offsets and soft-iron distortions may be dealt with;

the sample gain range can be calculated dynamically, allowing e.g., auto-scaling of parameters, which results in improved Kalman filter convergence;

Kalman filter processing may be started and stopped according to movement detection;

magnetic anomalies can be detected and managed.

In one or more embodiments, Kalman filter parameter auto-scaling according to amplitude of the incoming signal may be applied to a wide variety of magnetic-field sensing applications where a Kalman filter is used.

By relying on a geometric approach with a Kalman filter and eigenvectors, one or more embodiments may provide cost-effective solutions adapted for use in a wide range of devices.

BRIEF DESCRIPTION OF THE SEVERAL VIEWS OF THE DRAWINGS

One or more embodiments will now be described, by way of example only, with reference to the enclosed figures, wherein.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

A magnetic field (e.g., the magnetic field of the earth) and its possible distortions as sensed by magnetic field sensing devices such as magnetometers may be represented by plotting the output components X, Y, Z of the sensing signal as a graph in a three-dimensional (3D) coordinate space having an origin O (X=0, Y=0, Z=0).

Figure 1:
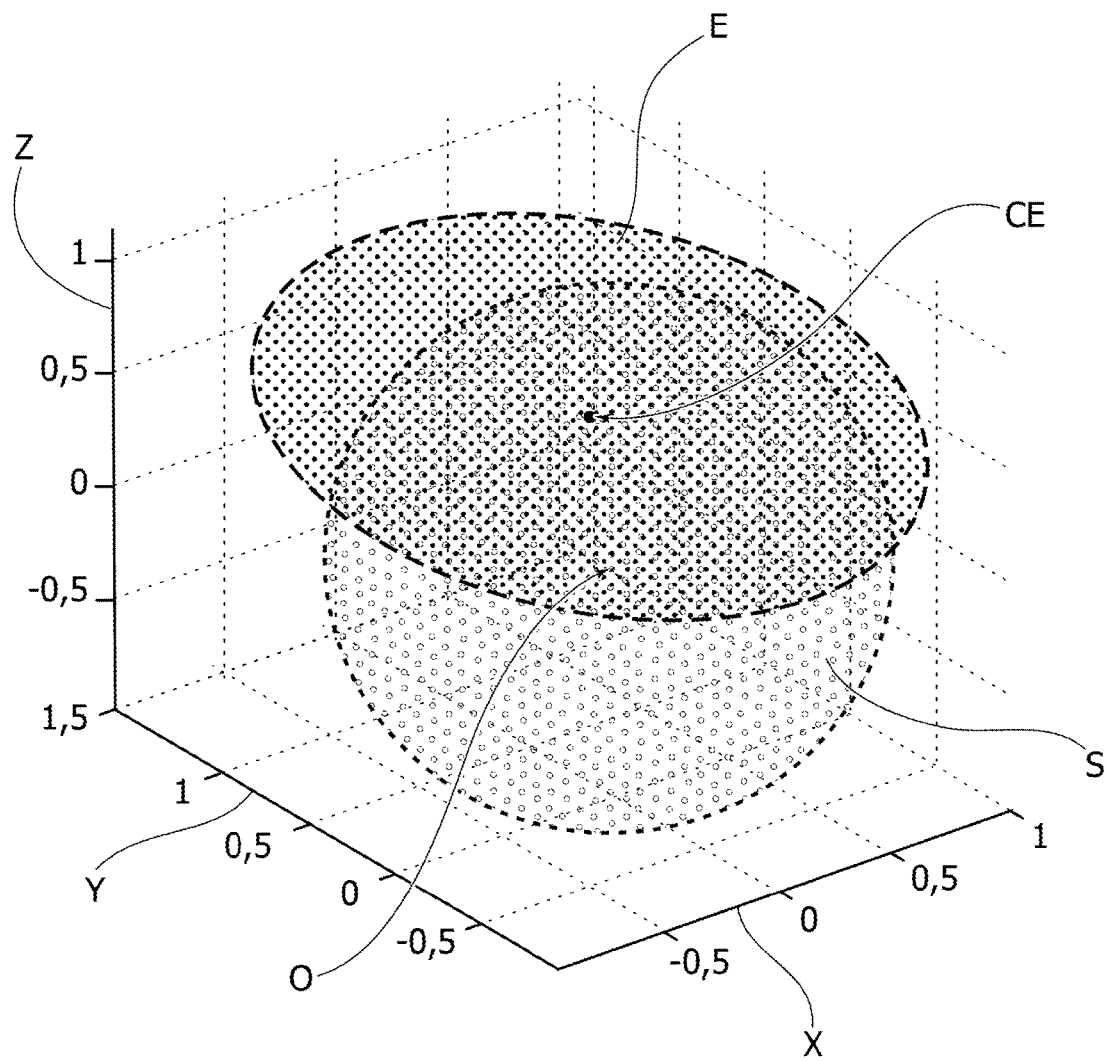
FIG. 1 is generally exemplary of the effects of hard-iron offsets and soft-iron distortions in a magnetic field sensing device.

Such a conventional representation is exemplified in FIG. 1.

In the absence of local disturbance, the three components of the measurement signal correspond to a vector representative of the local magnetic field having a radius equal to the radius of a sphere S centered at the origin O of the reference coordinate system.

As exemplified in FIG. 1 hard-iron (HI) offset effects will result in shifting the center of the 3D graph away from the origin O towards an offset center CE, without per se distorting the spherical shape of the graph.

Soft-iron distortion effects, on the other hand, will result in the spherical shape of the graph to be changed into an ellipsoidal shape E.

In an embodiment, an (auto) calibration process of such a magnetic field sensing device (a magnetometer will be referred to in the following for the sake of simplicity) recovers—from such an ellipsoidal graph E offset from the origin O—a non-offset, non-distorted signal components corresponding to a sphere S centered at the origin O as depicted in FIG. 1.

The foregoing may be represented as a matrix transformation as reproduced in the following:

$$\begin{bmatrix} X_{cal} \\ Y_{cal} \\ Z_{cal} \end{bmatrix} = \begin{bmatrix} M11 & M12 & M13 \\ M21 & M22 & M23 \\ M31 & M32 & M33 \end{bmatrix} * \left( \begin{bmatrix} X_{unc} \\ Y_{unc} \\ Z_{unc} \end{bmatrix} - \begin{bmatrix} O1 \\ O2 \\ O3 \end{bmatrix} \right)$$

where $X_{unc}$, $Y_{unc}$, $Z_{unc}$ represent the un-calibrated (offset and distorted) signal components, $X_{cal}$, $Y_{cal}$, $Z_{cal}$ represent the calibrated (non-offset and undistorted) signal components, O1, O2, O3 are three components representative of the offset of the center CE with respect to the origin O, and M11, . . . , M33 is a matrix representative of the geometric transformation of the ellipsoid E into a sphere S.

Figure 2:
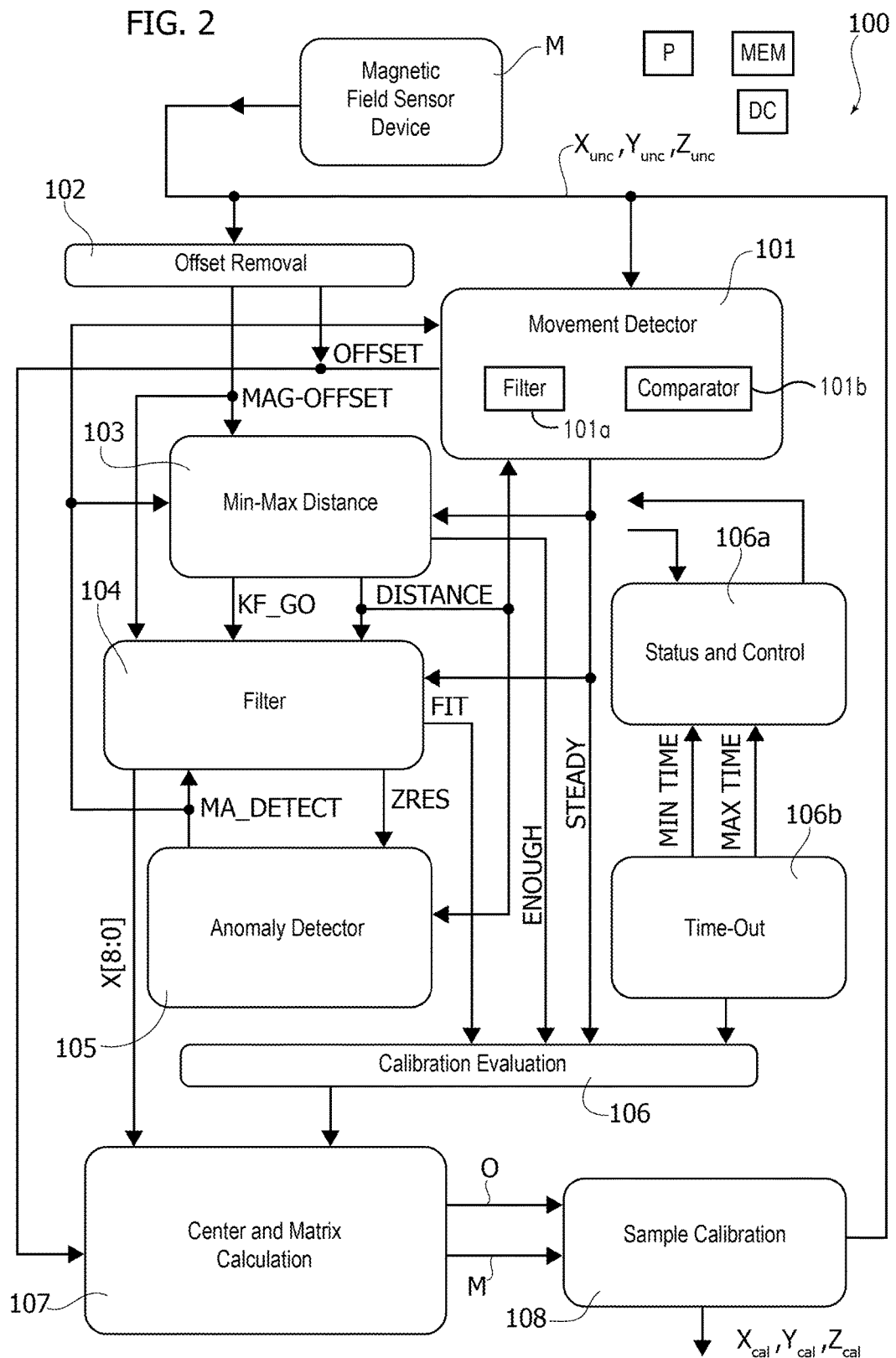
FIG. 2 is a block diagram of a system according to an embodiment.

FIG. 2 is a schematic representation of a block diagram of a system 100 according to embodiments as coupled to a magnetic field sensing device such as e.g., a magnetometer M.

In the following the device M will be assumed to produce three (generally un-calibrated) signal components $X_{unc}$, $Y_{unc}$, $Z_{unc}$ with the system 100 having the purpose of deriving therefrom corresponding (auto)calibrated signal components $X_{cal}$, $Y_{cal}$, $Z_{cal}$.

In one or more embodiments, the system 100 may be implemented either in hardware form or in software form or as a combination of hardware and software modules. Each blocks shown in FIG. 2 may thus be exemplary of hardware processing or software processing or mixed hardware/software processing. As illustrated, the system 100 comprises circuitry including a processor P, a memory MEM and discrete circuitry DC (e.g., amplifiers, adders, control logic, etc.), which may, alone or in various combinations, implement various functions of the system 100.

Also, partitioning of processing among the various blocks in FIG. 2 is merely for ease of explanation insofar as one or more embodiments may adopt different arrangements e.g., by consolidating or splitting any of the blocks as shown in the Figure.

In one or more embodiments as exemplified herein, data processing (including a Kalman filtering as discussed below) of the signal components X, Y, Z (unless specified otherwise, in the following the suffixes "unc" and "cal" distinguishing un-calibrated and calibrated components will be dropped for brevity) may be performed after a movement detection, that is after the sensing device (magnetometer) M is subject to movement.

In one or more embodiments, a movement detector block 101 may include a filter 101a such as a derivative filter to apply filtering (e.g., of a finite impulse response—FIR type) to each component X, Y, Z possibly followed by an exponential smoothed average of the absolute value.

In one or more embodiments, the movement detector block 101 may include a double threshold comparator 101b.

In one or more embodiments, the signal components X, Y, Z may be checked against upper (e.g., absolute value) thresholds, so that these upper absolute value thresholds being reached will be indicative of movement being started.

For instance, in order to assert that movement is starting, all the three average signal derivatives abs ($mdmag_{XYZ}$) may be checked to be above a start threshold (which may vary for the different components).

Likewise, in one or more embodiments, the signal components X, Y, Z may be checked against lower (e.g., absolute value) thresholds, so that these lower absolute value thresholds (which may vary for the different components) being reached will be indicative of movement being discontinued (e.g., stopped).

In that way, a movement may be asserted to be completed and the sensing device (magnetometer M) held to be still (stationary) when the three signals in question are below a stop threshold.

In one or more embodiments, such start (upper) and stop (lower) thresholds may be computed by multiplying programmed values by individual factors indicative of a distance (which may be possibly different for each component $mdmag_{XYZ}$) as possibly computed in a MIN-MAX distance block 103 to be described in the following.

In one or more embodiments, the movement detector block 101 may thus act like a sort of auto-scaling function of the thresholds according to the incoming data range thus allowing to deal automatically with e.g., large soft-iron distortion.

In one or more embodiments as exemplified in FIG. 2, the signal components $X_{unc}$, $Y_{unc}$, $Z_{unc}$ may also be fed to an offset removal block 102.

Signal components as possibly produced by a magnetometer M may be affected by offsets of tens of Gauss units, e.g., 50-60 times larger than the useful signal due to hard-iron distortion.

In one or more embodiments, the values of the signal components (samples) at the beginning of movement (as detected e.g., in the block 101) may be stored and subtracted to the subsequently incoming samples to be eventually restored at the end of calibration, e.g., by being added to the computed center.

In one or more embodiments, processing as performed in various blocks considered in the following may be performed on offset-scaled signal components (samples) $mag'_{XYZ}$ scaled e.g., by a scaling value $scale\_off_{XYZ}$ as stored upon movement of the sensing device M being detected, e.g., $mag'_{XYZ} = mag_{XYZ} - scale\_off_{XYZ}$, where $mag_{XYZ}$ denotes, in compact form, input samples $X_{unc}$, $Y_{unc}$, $Z_{unc}$ affected by offset.

In one or more embodiments, the MIN-MAX distance block 103 already mentioned in the foregoing may take into account the fact that the signal components X, Y, Z as produced by the device M may be effected by a wide range of soft-iron distortion, with the incoming signal range being generally unknown a priori.

In one or more embodiments, e.g., in order to better tune the Kalman filtering block 104 to be discussed in the following, the gain of the incoming signal may be estimated in the block 103.

In one or more embodiments, the maximum and minimum values of the signal components (samples) $max_{XYZ}$ and $min_{XYZ}$, respectively may be stored e.g., upon their arrival, individually for each of the three components X, Y, Z, by possibly defining the distance for each component X, Y, Z e.g., as:

$$distance_{XYZ} = abs(max_{XYZ} - min_{XYZ}).$$

In one or more embodiments, possibly after offset removal in block 102 and MIN-MAX distance evaluation in block 103, the input signal components (samples) may be fed to a Kalman filter block 104 along with an enable signal KF_GO.

In one or more embodiments, the purpose of such a filter is to yield a set of e.g., nine parameters that fit an ellipsoid shape (e.g., E in FIG. 1).

The quadratic form of an ellipsoid is:

$$ax^2 + 2bxy + 2cxz + dy^2 + 2eyz + fz^2 + 2gx + 2hy + 2iz + l = 0$$

$$B = \begin{bmatrix} a & b & c \\ b & d & e \\ c & e & f \end{bmatrix}$$

By denoting as m1, m2, m3 the X, Y, Z sample values:

$$-m1^2 = \frac{d}{a}m2^2 + \frac{f}{a}m3^2 + \frac{2g}{a}m1 + \frac{2h}{a}m2 +$$
$$\frac{2i}{a}m3 + \frac{l}{a} + \frac{2b}{a}m1m2 + \frac{2c}{a}m1m3 + \frac{2e}{a}m2m3$$

$$z_n = -m1^2$$

$$H_n = [\, m2^2 \quad m3^2 \quad 2m1 \quad 2m2 \quad 2m3 \quad 1 \quad 2m1m2 \quad 2m1m3 \quad 2m2m3 \,]$$

$$X_n = [\, X(0) \quad X(1) \quad X(2) \quad X(3) \quad X(4) \quad X(5) \quad X(6) \quad X(7) \quad X(8) \,]$$

$$zres = z_n - z'_n = z_n - H_n X_{n-1}$$

the Kalman procedure may be based on two phases, namely:
predicting values $$X'_n = X_{n-1}$$

$$P'_n = P_{n-1} + Q$$

$$z'_n = H_n X'_n$$

and
correcting values $$k_n = P'_n H_n / (H_n P'_n H_n^T + R)$$

$$X_n = X'_n + k_n(z_n - z'_n)$$

$$P_n = (I - k_n H_n) P'_n$$

where, according to conventional notation, n−1 and n indicate generic subsequent steps in Kalman filter operation.

The diagonal matrix Q and the scalar R are respectively the process and output noise covariance.

Adequate filter performance in terms of fitting speed may be reached by scaling the output noise covariance according to the computed $distance_{XYZ}$, such as $R = Ro*median(distance_{XYZ})^4$.

The e.g., nine ellipsoid parameters thus computed may be denoted X (8:0).

In one or more embodiments, a magnetic anomaly detector block 105 may be provided.

In one or more embodiments, operation of such a block 105 may assume that the Kalman filter 104 has a fit, meaning that the data provided by the magnetic field sensing device (e.g., magnetometer M) belong to an ellipsoid.

In one or more embodiments, the block 105 may receive from the block 104 the Kalman residual zres, that is the difference between the predicted system output and the real samples assumes an abnormal value.

In one or more embodiments, operation of the block 105 may involve checking if the difference between the output signal as predicted by Kalman filter processing and the current magnetometer output signal reaches an anomaly threshold.

If the difference in question reaches the anomaly threshold (see e.g., the flag MA_DETECT in FIG. 2) Kalman filter processing in the block 104 may be discontinued to be resumed e.g., at a subsequent movement of the device (magnetometer M), optionally from a reset condition.

In one or more embodiments, managing the zres behavior may involve computing a smoothed (e.g., exponential) mean or average, peak-detector like: when no anomaly is detected, the average value may assume the value of |zres|; when anomaly is detected, than it may become:

$$mzres(n) = a\, mzres(n-1) + (1-a)|zres(n)|,$$

where n and n−1 denote two subsequent processing steps.

In one or more embodiments, when the residual mean mzres starts to grow and exceeds of threshold (possibly scaled by the squared $distance_x$) than the MA_DETECT flag may be issued towards the Kalman filter block 104 so that Kalman filtering may be stopped to be restarted, e.g., from a reset condition at a next movement.

In one or more embodiments the magnetic anomaly MA_DETECT flag may be cleared once the residual mean mzres is below a captioned threshold, meaning that the anomaly has disappeared.

The block 106 in FIG. 2 is exemplary of the evaluation of certain calibration flags, such as e.g.:

the Kalman filter 104 has to fit the ellipsoid shape E, three delay counters have reached a programmed value, meaning that each component distance distance$_{XYZ}$ has exceeded a programmable lowest distance for a given number of samples, a minimum time has elapsed between two subsequent calibration procedures, the system is in a steady condition, meaning that a movement has been completed.

In one or more embodiments, flags such as those exemplified in the foregoing may be generated in a status and control block 106*a* and a timeout block 106*b* with the time out block sending e.g., MINTIME and MAXTIME signals to the status and control block 106*a*.

In one or more embodiments, certain status flags are collected in 106*a*, such as Kalman filter fitting status, magnetic anomaly detection, steady/movement status, timeout status etc., to be read-back by a host processor. In one or more embodiments, a calibration event may occur:

not before a MINTIME number of samples from a previous calibration event, and not after a MAXTIME number of samples from a previous calibration event or from the procedure start.

If a MAXTIME number of samples are exceeded without a calibration event, then the Kalman filter is reset and the overall process is restarted.

When the conditions expressed by the flags above are checked to be verified in the block 106, operation of a block 107 for a matrix and center calculation may be enabled.

In one or more embodiments, the related processing may be executed starting from the output X (8:0) from the Kalman filter block 104.

In one or more embodiments, processing in the block 107 may involve four phases: translation, rotation, scaling and back-rotation.

Translation processing aims at translating the center of the ellipsoid E towards the origin O of the three-dimensional coordinate system of FIG. 1.

In one or more embodiments, this may involve solving a system of linear equations in order to obtain the center coordinates:

$$[x0\,y0\,z0]^T = -B^{-1}[g\,h\,i]^T$$

In one or more embodiments, translation to the center may involve a variable substitution such as:

$$\begin{bmatrix} x\_transl \\ y\_transl \\ z\_transl \end{bmatrix} = \begin{bmatrix} x - x0 \\ y - y0 \\ z - z0 \end{bmatrix}$$

where _transl denotes a translated coordinate.

In one or more embodiments, the rotation processing rotates the ellipsoid E to align the ellipsoid axes with the axes of the sensing device (e.g., magnetometer M).

The ellipsoid axes are the eigenvectors of the matrix B introduced in the foregoing.

Rotation may be based on a matrix V including the resulting eigenvectors to perform the rotation:

$$\begin{bmatrix} x\_rot \\ y\_rot \\ z\_rot \end{bmatrix} = V^T * \begin{bmatrix} x\_transl \\ y\_transl \\ z\_transl \end{bmatrix}$$

where _rot denotes rotated coordinate obtained from the translated coordinates _transl.

The foregoing results in having an ellipsoid which is both centered at the origin O and with its axes aligned with the axes of the sensing device.

Its quadratic form will be:

$$\lambda 1 x\_rot^2 + \lambda 2 y\_rot^2 + \lambda 3 z\_rot^2 = R^2$$

where $\lambda 1$, $\lambda 2$ and $\lambda 3$ are the eigenvalues of the matrix B and $$R = (-l + [x0\,y0\,z0]B[x0\,y0\,z0]^T)^{1/2}$$

Scaling processing aims at scaling the ellipsoid E to a sphere S.

The ellipsoid semi-axes may be represented as $$R/(\lambda 1)^{1/2} \quad R/(\lambda 2)^{1/2} \quad R(\lambda 3)^{1/2}$$

and the scaling matrix may be represented as follows:

$$scale = \begin{bmatrix} \sqrt{\lambda_1} & 0 & 0 \\ 0 & \sqrt{\lambda_2} & 0 \\ 0 & 0 & \sqrt{\lambda_3} \end{bmatrix} * \frac{1}{R} * LMF$$

where LMF is a gain term possibly equal to the local magnetic field.

To sum up:

$$\begin{bmatrix} x_{sphere} \\ y_{sphere} \\ z_{sphere} \end{bmatrix} = scale * \begin{bmatrix} x\_rot \\ y\_rot \\ z\_rot \end{bmatrix} = scale * V^T * \begin{bmatrix} x\_trasl \\ y\_trasl \\ z\_trasl \end{bmatrix}$$

Back-rotation aims at back-rotating the sphere resulting from scaling to the orientation of the ellipsoid before the rotation considered in the foregoing.

In one or more embodiments, back-rotation may involve multiplication for the matrix V:

$$\begin{bmatrix} x_{sphere\_fin} \\ y_{sphere\_fin} \\ z_{sphere\_fin} \end{bmatrix} = V * \begin{bmatrix} x_{sphere} \\ y_{sphere} \\ z_{sphere} \end{bmatrix}$$

$$= V * scale * \begin{bmatrix} x\_rot \\ y\_rot \\ z\_rot \end{bmatrix}$$

$$= V * scale * V^T *$$

$$\begin{bmatrix} x\_trasl \\ y\_trasl \\ z\_trasl \end{bmatrix} = V * scale * V^T * \begin{bmatrix} x - x0 \\ y - y0 \\ z - z0 \end{bmatrix}$$

The foregoing results in a centered sphere S having a radius LMF without any additional rotation.

In one or more embodiments, processing as performed in the block 107 may result in the generation of a vector O and a matrix M for hard-iron offset correction and soft-iron distortion correction of the signal components.

In one or more embodiments this may take the form of an offset vector [x0 y0 z0] and a gain matrix $M = V * scale * V^T$.

In a sample calibration block 108 the offset stored at the beginning of processing (as a result of processing performed in block 102) may be restored and added to the ellipsoid center to yield a final hard-iron offset correction in the form $$O=[x0\,y0\,z0]+\text{scale\_off}_{XYZ}$$

In one or more embodiments, the calibrated samples at the output of the block 108 may be obtained as:

$$\begin{bmatrix} X_{cal} \\ Y_{cal} \\ Z_{cal} \end{bmatrix} = \begin{bmatrix} M11 & M12 & M13 \\ M21 & M22 & M23 \\ M31 & M32 & M33 \end{bmatrix} * \left( \begin{bmatrix} X_{unc} \\ Y_{unc} \\ Z_{unc} \end{bmatrix} - \begin{bmatrix} O1 \\ O2 \\ O3 \end{bmatrix} \right)$$

Without prejudice to the underlying principles, the details and embodiments may vary, even significantly, with respect to what has been described by way of example only without departing from the extent of protection.

The extent of protection is defined by the annexed claims.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   receiving signal components of a magnetic field sensing device, the signal components corresponding to an uncalibrated representation of a sensed magnetic field in a three-dimensional coordinate system;
   determining a center offset based on the received signal components;
   adjusting the signal components based on the determined center offset;
   estimating a gain of the adjusted signal components based on a difference of maximum and minimum values of the adjusted signal components;
   applying Kalman filtering to the adjusted signal components, generating a set of ellipsoid parameters, the Kalman filtering being tuned based on the estimated gain of the adjusted signal components; and
   generating calibrated signal components based on the determined center offset and the generated set of ellipsoid parameters.

2. The method of claim 1 wherein the generated calibrated signal components correspond to a centered, spherical magnetic field in the three-dimensional coordinate system.

3. The method of claim 1 wherein,
   with said ellipsoid parameters defining an ellipsoid in quadratic form as:

$$ax^2 + 2bxy + 2cxz + dy^2 + 2eyz + fz^2 + 2gx + 2hy + 2iz + l = 0$$

$$B = \begin{bmatrix} a & b & c \\ b & d & e \\ c & e & f \end{bmatrix}$$

and with m1, m2, m3 representing respective received signal components in the three-dimensional coordinate system:

$$-m1^2 = \frac{d}{a}m2^2 + \frac{f}{a}m3^2 + \frac{2g}{a}m1 + \frac{2h}{a}m2 +$$
$$\frac{2i}{a}m3 + \frac{l}{a} + \frac{2b}{a}m1m2 + \frac{2c}{a}m1m3 + \frac{2e}{a}m2m3$$

$$z_n = -m1^2$$

$$H_n = [\, m2^2 \quad m3^2 \quad 2m1 \quad 2m2 \quad 2m3 \quad 1 \quad 2m1m2 \quad 2m1m3 \quad 2m2m3 \,]$$

$$X_n = [\, X(0) \quad X(1) \quad X(2) \quad X(3) \quad X(4) \quad X(5) \quad X(6) \quad X(7) \quad X(8) \,]$$

$$zres = z_n - z'_n = z_n - H_n X_{n-1}$$

said applying Kalman filter includes:
   predicting values $$X'_n = X_{n-1}$$

$$P'_n = P_{n-1} + Q$$

$$z'_n = H_n X'_n;$$

and
   correcting values $$k_n = P'_n H_n / (H_n P'_n H_n^T + R)$$

$$X_n = X'_n + k_n(z_n - z'_n)$$

$$P_n = (I - k_n H_n) P'_n.$$

4. The method of claim 1, comprising:
   detecting movement of the magnetic field sensing device;
   storing values of said received signal components from the magnetic field sensing device upon detecting movement of the magnetic field sensing device; and
   subtracting the values stored from subsequently received signal components prior to applying said Kalman filtering.

5. The method of claim 4, comprising:
adjusting the determined center component based on said stored values before generating the calibrated signal components.

6. The method of claim 1, comprising:
comparing a difference between signal components predicted based on the Kalman filtering and current received signal components to an anomaly threshold;
discontinuing Kalman filtering when the difference reaches the anomaly threshold; and
resuming Kalman filtering when movement of the magnetic field sensing device from a rest position is detected.

7. A method, comprising:
receiving signal components of a magnetic field sensing device, the signal components corresponding to an uncalibrated representation of a sensed magnetic field in a three-dimensional coordinate system;
determining a center offset based on the received signal components;
adjusting the signal components based on the determined center offset;
estimating a gain of the adjusted signal components based on a difference of minimum and maximum values of the adjusted signal components;
applying Kalman filtering to the adjusted signal components, generating a set of ellipsoid parameters, the Kalman filtering being tuned based on the estimated gain of the adjusted signal components; and
generating calibrated signal components based on the determined center offset and the generated set of ellipsoid parameters, wherein the generating calibrated signal components comprises:
translating an ellipsoid center corresponding to the ellipsoid parameters to an origin of the three-dimensional coordinate system;
rotating axes corresponding to the ellipsoid parameters to align with axes of the three-dimensional coordinate system;
scaling the ellipsoid parameters to define a sphere; and
rotating axes of the defined sphere to align with a pre-rotation orientation of the axes corresponding to the ellipsoid parameters.

8. The method of claim 7, comprising:
comparing absolute values of said received signal components to upper value thresholds, said upper value thresholds being reached being indicative of a starting of movement of the magnetic field sensing device;
comparing absolute values of said received signal components to lower value thresholds, said lower value thresholds being reached being indicative of a stopping of movement of the magnetic field sensing device; and
selectively applying said Kalman filtering based on detecting movement of the magnetic field sensing device.

9. A device, comprising:
an input, which, in operation, receives signal components of a magnetic field sensing device, the signal components corresponding to an uncalibrated representation of a sensed magnetic field in a three-dimensional coordinate system; and
circuitry coupled to the input, wherein the circuitry, in operation:
determines a center offset based on the received signal components;
adjusts the signal components based on the determined center offset;
estimates a gain of the adjusted signal components based on a difference of maximum and minimum values of the adjusted signal components;
applies Kalman filtering to the adjusted signal components, generating a set of ellipsoid parameters, the Kalman filtering being tuned based on the estimated gain of the adjusted signal components; and
generates calibrated signal components based on the determined center offset and the generated set of ellipsoid parameters.

10. The device of claim 9 wherein the generated calibrated signal components correspond to a centered, spherical magnetic field in the three-dimensional coordinate system.

11. The device of claim 9 wherein the circuitry, in operation:
compares a difference between signal components predicted based on Kalman filtering and current received signal components to an anomaly threshold;
discontinues Kalman filtering when the difference reaches the anomaly threshold; and
resumes Kalman filtering in response to detecting movement of the magnetic field sensing device from a rest position.

12. The device of claim 9 wherein the circuitry, in operation, filters the received signal components.

13. The device of claim 9 wherein the circuitry, in operation, averages the received signal components.

14. A device, comprising:
an input, which, in operation, receives signal components of a magnetic field sensing device, the signal components corresponding to an uncalibrated representation of a sensed magnetic field in a three-dimensional coordinate system; and
circuitry coupled to the input, wherein the circuitry, in operation:
determines a center offset based on the received signal components;
adjusts the signal components based on the determined center offset;
estimates a gain of the adjusted signal components based on a difference of maximum and minimum values of the adjusted signal components;
applies Kalman filtering to the adjusted signal components, generating a set of ellipsoid parameters, the Kalman filtering being tuned based on the estimated gain of the adjusted signal components; and
generates calibrated signal components based on the determined center offset and the generated set of ellipsoid parameters, wherein the circuitry, in operation, generates the calibrated signal components by:
translating an ellipsoid center corresponding to the ellipsoid parameters to an origin of the three-dimensional coordinate system;
rotating axes corresponding to the ellipsoid parameters to align with axes of the three-dimensional coordinate system;
scaling the ellipsoid parameters to define a sphere; and
rotating axes of the defined sphere to align with a pre-rotation orientation of the axes corresponding to the ellipsoid parameters.

15. The device of claim 14 wherein the circuitry, in operation:
compares absolute values of said received signal components to upper value thresholds, said upper value thresholds being reached being indicative of a starting of movement of the magnetic field sensing device;

compares absolute values of said received signal components to lower value thresholds, said lower value thresholds being reached being indicative of a stopping of movement of the magnetic field sensing device; and selectively applies said Kalman filtering based on detecting movement of the magnetic field sensing device.

16. The device of claim 14 wherein the circuitry, in operation, filters the received signal components.

17. The device of claim 14 wherein the circuitry, in operation, averages the received signal components.

18. A device, comprising:
an input, which, in operation, receives signal components of a magnetic field sensing device, the signal components corresponding to an uncalibrated representation of a sensed magnetic field in a three-dimensional coordinate system; and
circuitry coupled to the input, wherein the circuitry, in operation:
determines a center offset based on the received signal components;
adjusts the signal components based on the determined center offset;
estimates a gain of the adjusted signal components based on a difference of maximum and minimum values of the adjusted signal components;
applies Kalman filtering to the adjusted signal components, generating a set of ellipsoid parameters, the Kalman filtering being tuned based on the estimated gain of the adjusted signal components; and
generates calibrated signal components based on the determined center offset and the generated set of ellipsoid parameters, wherein the circuitry, in operation:
detects movement of the magnetic field sensing device;
stores values of said received signal components from the magnetic field sensing device upon detecting movement of the magnetic field sensing device; and
subtracts the values stored from subsequently received signal components prior to applying said Kalman filtering.

19. The device of claim 18 wherein the circuitry, in operation:
adjusts the determined center component based on said stored values before generating the calibrated signal components.

20. A system, comprising:
a magnetic field sensor configured to generate signal components corresponding to an uncalibrated representation of a sensed magnetic field in a three-dimensional coordinate system; and
reading circuitry coupled to the magnetic field sensor and configured to:
determine a center offset based on received signal components;
adjust the received signal components based on the determined center offset;
estimate a gain of the adjusted signal components based on a difference of maximum and minimum values of the adjusted signal components;
apply Kalman filtering to the adjusted signal components, generating a set of ellipsoid parameters, the Kalman filtering being tuned based on the estimated gain of the adjusted signal components; and
generate calibrated signal components based on the determined center offset and the generated set of ellipsoid parameters, wherein the reading circuitry is configured to generate the calibrated signal components by:
translating an ellipsoid center corresponding to the ellipsoid parameters to an origin of the three-dimensional coordinate system;
rotating axes corresponding to the ellipsoid parameters to align with axes of the three-dimensional coordinate system;
scaling the ellipsoid parameters to define a sphere; and
rotating axes of the defined sphere to align with a pre-rotation orientation of the axes corresponding to the ellipsoid parameters.

21. The system of claim 20 wherein the generated calibrated signal components correspond to a centered, spherical magnetic field in the three-dimensional coordinate system.

22. A non-transitory computer-readable medium having contents which configure a magnetic field sensor reading device to perform a method, the method comprising:
determining a center offset based on signal components generated by a magnetic field sensing device, the signal components corresponding to an uncalibrated representation of a sensed magnetic field in a three-dimensional coordinate system;
adjusting the signal components based on the determined center offset;
estimating a gain of the adjusted signal components based on a difference of maximum and minimum values of the adjusted signal components;
applying Kalman filtering to the adjusted signal components, generating a set of ellipsoid parameters, the Kalman filtering being tuned based on the estimated gain of the adjusted signal components; and
generating calibrated signal components based on the determined center offset and the generated set of ellipsoid parameters, wherein the generating the calibrated signal components includes:
translating an ellipsoid center corresponding to the ellipsoid parameters to an origin of the three-dimensional coordinate system;
rotating axes corresponding to the ellipsoid parameters to align with axes of the three-dimensional coordinate system;
scaling the ellipsoid parameters to define a sphere; and
rotating axes of the defined sphere to align with a pre-rotation orientation of the axes corresponding to the ellipsoid parameters.

23. The non-transitory computer-readable medium of claim 22 wherein the method comprises filtering the received signal components.

24. The non-transitory computer-readable medium of claim 22 wherein the method comprises averaging the received signal components.

* * * * *